(12) United States Patent
Misumi (10) Patent No.: US 7,151,316 B2
(45) Date of Patent: Dec. 19, 2006

(54) SEMICONDUCTOR DEVICE (75) Inventor: Kazuyuki Misumi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 18 days.

(21) Appl. No.: 10/886,649

(22) Filed: Jul. 9, 2004

(65) Prior Publication Data
US 2005/0006764 A1 Jan. 13, 2005

(30) Foreign Application Priority Data
Jul. 9, 2003 (JP) ............... 2003-194392

(51) Int. Cl.
*H01L 21/469* (2006.01)
(52) U.S. Cl. ..................... 257/777; 257/686
(58) Field of Classification Search ............... 257/686, 257/777, 778, 734, 691, 666; 438/108, 109
See application file for complete search history.

(56) References Cited

U.S. PATENT DOCUMENTS

| | | |
|---|---|---|
| 5,789,816 A | 8/1998 | Wu |
| 6,414,387 B1 * | 7/2002 | Hara et al. ................. 257/691 |
| 2004/0041249 A1 * | 3/2004 | Tsai et al. .................. 257/686 |

FOREIGN PATENT DOCUMENTS

| | | |
|---|---|---|
| JP | 11-312705 | 11/1999 |
| JP | 2000-68404 A | 3/2000 |

* cited by examiner

*Primary Examiner*—Howard Weiss
*Assistant Examiner*—(Vikki) Hoa B. Trinh
(74) *Attorney, Agent, or Firm*—McDermott Will & Emery LLP (57) ABSTRACT

A semiconductor device includes a substrate, a plurality of bonding fingers formed on the surface of the substrate, and a semiconductor element arranged above the surface of the substrate and having a plurality of connection pads on a surface opposite to a surface facing the substrate. The plurality of connection pads have a connection pad group aligned in the vicinity of a side of the semiconductor element along the same. The plurality of bonding fingers have a bonding finger arranged outside sides adjacent to sides of the semiconductor element along which the connection pad group is arranged. The connection pad group has the connection pad electrically connected to the bonding finger by wire bonding. Therefore, a semiconductor device attaining improved degree of freedom in routing without lowering quality and efficient reduction in its outer dimension is obtained.

4 Claims, 14 Drawing Sheets

× CONTACT WITH SEMICONDUCTOR ELEMENT

FIG.9

× PROXIMATE GOLD WIRES

SEMICONDUCTOR DEVICE

BACKGROUND OF THE INVENTION

1. Field of the Invention

The present invention relates to a semiconductor device, and more particularly to a semiconductor device having bonding pads on two sides of a semiconductor chip.

2. Description of the Background Art

In a semiconductor device of a conventional BGA (Ball Grid Array) type, a semiconductor element (semiconductor chip) is fixed and adhered to a substrate made of glass epoxy resin, for example, with its active surface facing up. A connection pad (bonding pad) on the semiconductor element is connected to a bonding finger on the substrate by a wire made of gold, for example. The bonding finger is connected to a ball land by a copper interconnection. The ball land is provided for attachment of a solder ball provided for external connection. Such a BGA-type semiconductor device is disclosed, for example, in Japanese Patent Laying-Open Nos. 2000-68404 and 11-312705.

In the semiconductor element such as a memory, the connection pads are usually arranged along two sides of the semiconductor element, and the bonding fingers are generally arranged outside the side along which the connection pads are arranged. The wire for wire bonding is drawn out from the connection pad in a direction toward the outside of the side along which the connection pads are arranged.

An electric signal from the semiconductor element is taken out through a route from the connection pad through the bonding (wire), a copper interconnection on the substrate (including the bonding finger and an interconnection in a via) and the ball land to the solder ball. Such a routing is two-dimensional except for routing in the via, and intersection of interconnections is not allowed on the identical surface of the substrate. Accordingly, as the order or arrangement of the connection pads of the semiconductor element and pin arrangement of the solder ball are restricted, the order or the arrangement of the connection pads should be considered in advance at the time of designing the semiconductor element. In addition, when a product such as an existing semiconductor element of which design has already been completed and which can no longer accept consideration is employed, interconnections intersect two-dimensionally, resulting in failure in routing (failure in substrate design).

In general, a pitch between connection pads on the semiconductor element is smaller than that between pads of the bonding fingers. Therefore, in the conventional semiconductor device and structure, a package size necessarily tends to be restricted by a minimal dimension of the bonding finger.

Though the number of layers of the substrate may be increased in order to enable routing, this will cause cost increase as well as larger thickness of the substrate itself. Accordingly, the total height of the semiconductor device is increased, which will cause incompatibility with conventional products.

SUMMARY OF THE INVENTION

The present invention was made to solve the above-described problems. An object of the present invention is to improve a degree of freedom in routing without lowering a quality as well as to efficiently reduce an outer dimension of the semiconductor device.

A semiconductor device according to the present invention includes a substrate, a plurality of bonded portions, and a semiconductor element. The plurality of bonded portions are formed on a surface of the substrate. The semiconductor element is arranged above the surface of the substrate and has a plurality of connection pads on a surface opposite to a surface facing the substrate. The plurality of connection pads have a connection pad group aligned in the vicinity of one side of the semiconductor element along the same. The plurality of bonded portions have an adjacent side bonded portion arranged outside a side adjacent to the side of the semiconductor element along which the connection pad group is arranged. The connection pad group has a connection pad electrically connected to the adjacent side bonded portion by wire bonding.

According to the semiconductor device of the present invention, the bonded portion is arranged outside the side adjacent to the side along which the connection pad group is arranged, and the connection pad is connected to the bonded portion by wire bonding. Therefore, intersection of the interconnections arranged on the substrate or three-dimensional intersection of the bonding wires can be prevented, leading to smaller outer size of the semiconductor device. In this manner, the degree of freedom in routing can be improved without lowering the quality and the outer dimension of the semiconductor device can efficiently be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention will be described with reference to the figures.

(First Embodiment)

Figure 1:
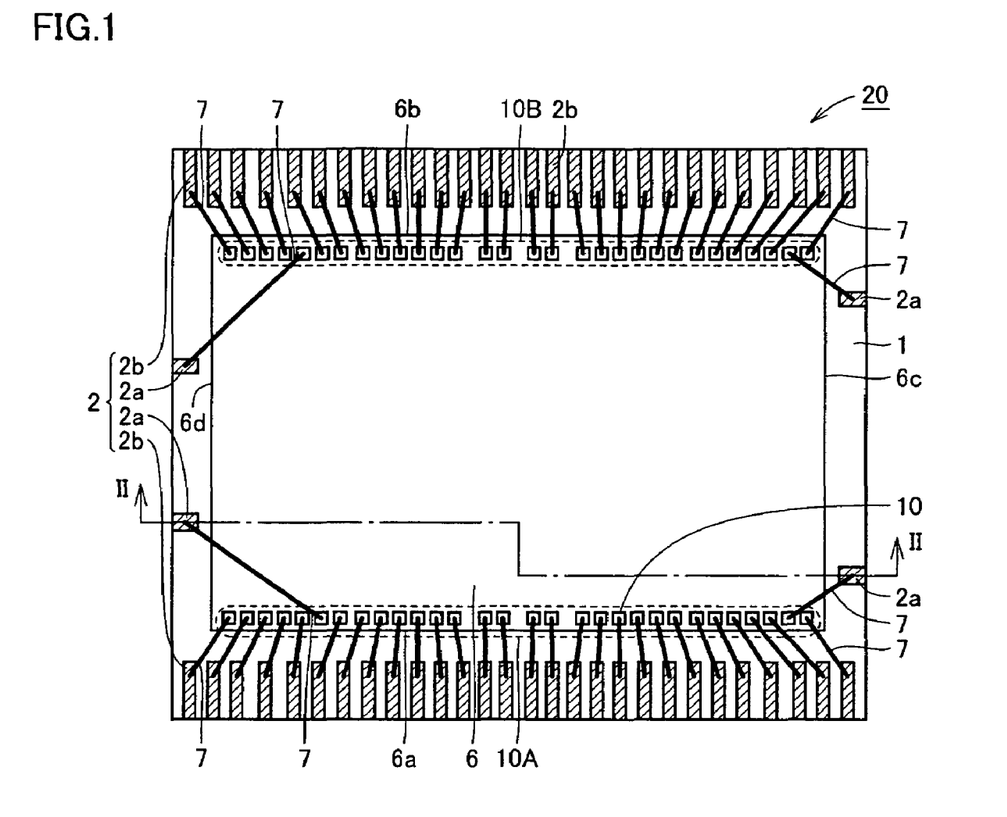
FIG. 1 is a plan view schematically showing a configuration of a semiconductor device in a first embodiment of the present invention, without showing a mold resin.
Figure 2:
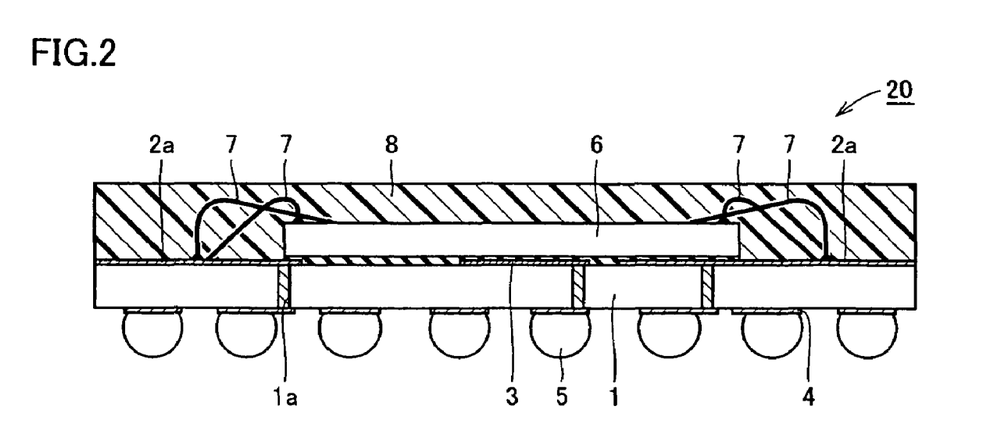
FIG. 2 is a schematic cross-sectional view along the line II—II in FIG. 1.

Referring to FIGS. 1 and 2, a semiconductor device 20 in the present embodiment mainly includes a substrate 1, a bonding finger (bonded portion) 2, copper interconnections 3, ball lands 4, solder balls 5, a semiconductor element 6, bonding wires 7, and a mold resin 8.

Substrate 1 is made of a glass epoxy resin, for example. On one surface of substrate 1, bonding finger 2 and copper interconnection 3 electrically connected to bonding finger 2 are formed. On the other surface of substrate 1, ball land 4 is formed. Bonding finger 2 and copper interconnection 3 on one surface are electrically connected to ball land 4 on the other surface through a conductive layer in a via (through hole) 1a formed in substrate 1. Solder ball 5 for external connection is formed on ball land 4.

Semiconductor element 6 is a semiconductor chip, for example. Semiconductor element 6 has a plurality of connection pads (bonding pads) 10 on its surface. Each of the plurality of connection pads 10 is electrically connected to a circuit in semiconductor element 6. The plurality of connection pads 10 have respective connection pad groups 110A, 10B aligned in the vicinity of sides 6a, 6b of semiconductor element 6 respectively. In a memory such as a DRAM (Dynamic Random Access Memory), in general, connection pad groups 10A and 10B are arranged along two sides 6a and 6b of semiconductor element 6 respectively.

Semiconductor element 6 is arranged above the surface of substrate 1. In such an arrangement, the surface of semiconductor element 6 where connection pads 10 are not present is connected to one surface of substrate 1 with an adhesive or the like.

The plurality of connection pads 10 of semiconductor element 6 are electrically connected to the plurality of bonding fingers 2 respectively by bonding wires 7 implemented by a gold wire, for example. Mold resin 8 is molded on one surface of substrate 1 so as to cover bonding finger 2, copper interconnection 3, semiconductor element 6, bonding wire 7, and the like.

In the present embodiment, the plurality of bonding fingers 2 have a bonding finger (adjacent side bonded portion) 2a and a bonding finger 2b. Bonding finger 2a is arranged outside sides 6c and 6d that are adjacent to sides 6a, 6b of semiconductor element 6 along which connection pad groups 10A and 10B are arranged respectively. Bonding finger 2b is arranged outside sides 6a and 6b.

Each of connection pad groups 10A and 10B has connection pads 10 electrically connected to bonding fingers 2a respectively by wire bonding (that is, via bonding wire 7). In addition, each of connection pad groups 10A and 10B has connection pads 10 electrically connected to bonding fingers 2b respectively by wire bonding.

It is noted that inner connection pad 10 other than that at an end portion of connection pad groups 10A and 10B arranged in a line respectively may electrically be connected to bonding finger 2a by wire bonding.

Figure 3:
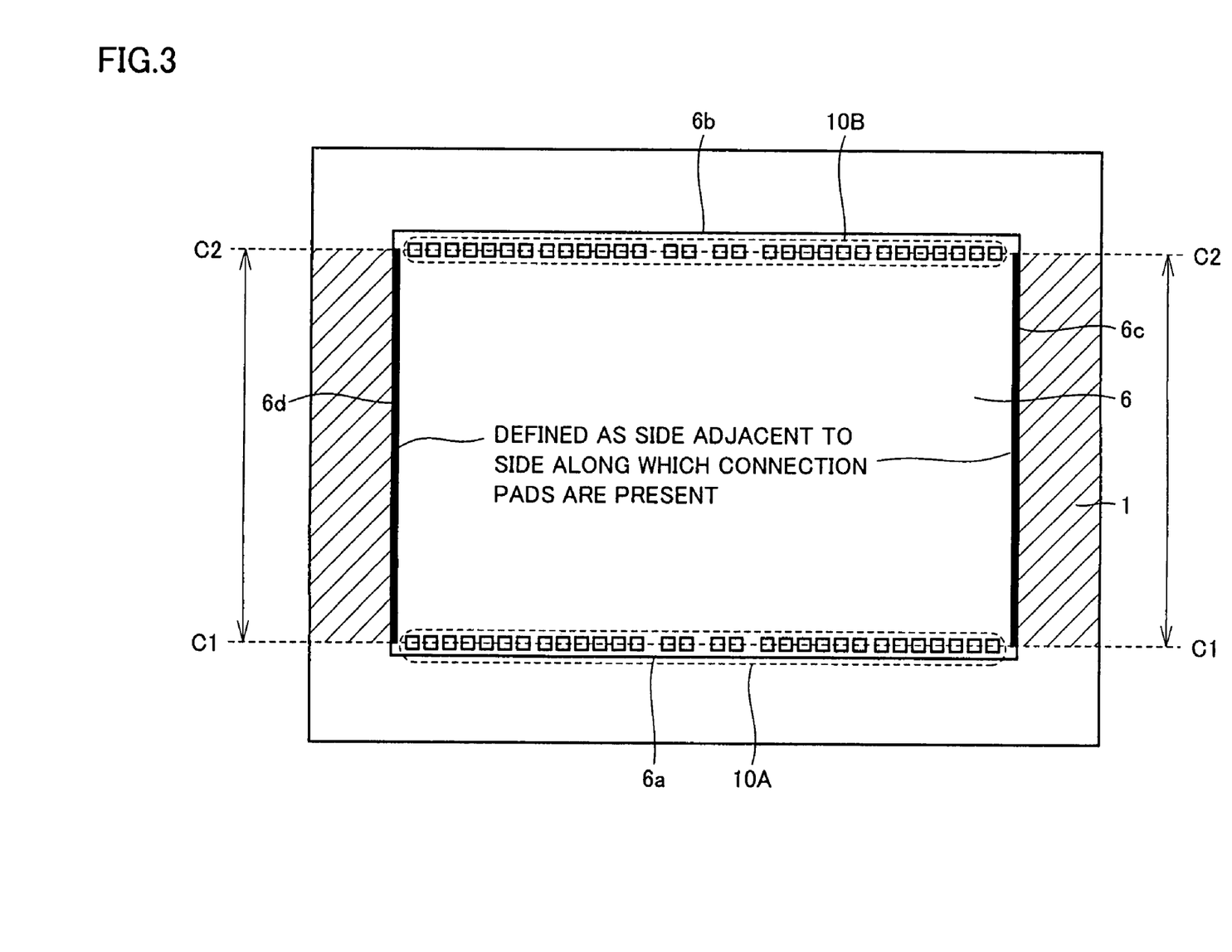
FIG. 3 is a diagram for illustrating a definition of "a side adjacent to a side of a semiconductor element along which a connection pad group is arranged" in the present specification.

Here, the phrase "the side adjacent to the side of the semiconductor element along which the connection pad group is arranged" refers to portions of sides 6c, 6d between a centerline C1—C1 of connection pad group 10A and a centerline C2—C2 of connection pad group 10B (portions shown with bold line), as shown in FIG. 3. Therefore, the phrase "outside the side adjacent to the side of the semiconductor element along which the connection pad group is arranged" herein refers to surface areas (hatched areas) of substrate 1 outside the portions (portions shown with bold line) of sides 6c, 6d between centerline C1—C1 and centerline C2—C2 shown in FIG. 3.

Figure 4:
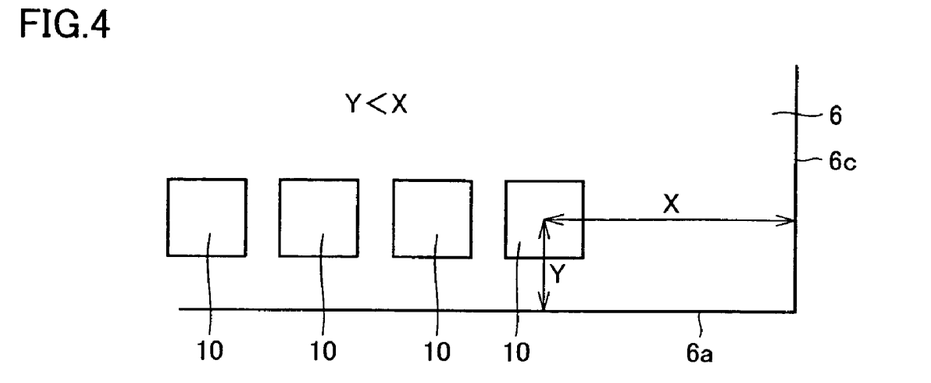
FIG. 4 illustrates a distance between the side and positions of connection pads of the semiconductor element.

A direction in which bonding wire 7 is drawn out from connection pad 10 is generally set to a shorter Y direction out of X and Y directions shown in FIG. 4. In the present embodiment, however, bonding wire 7 is positively drawn out in a longer X direction, so that the degree of freedom in routing can drastically be improved without lowering the quality due to intersection of bonding wires 7 as described later.

Figure 5:
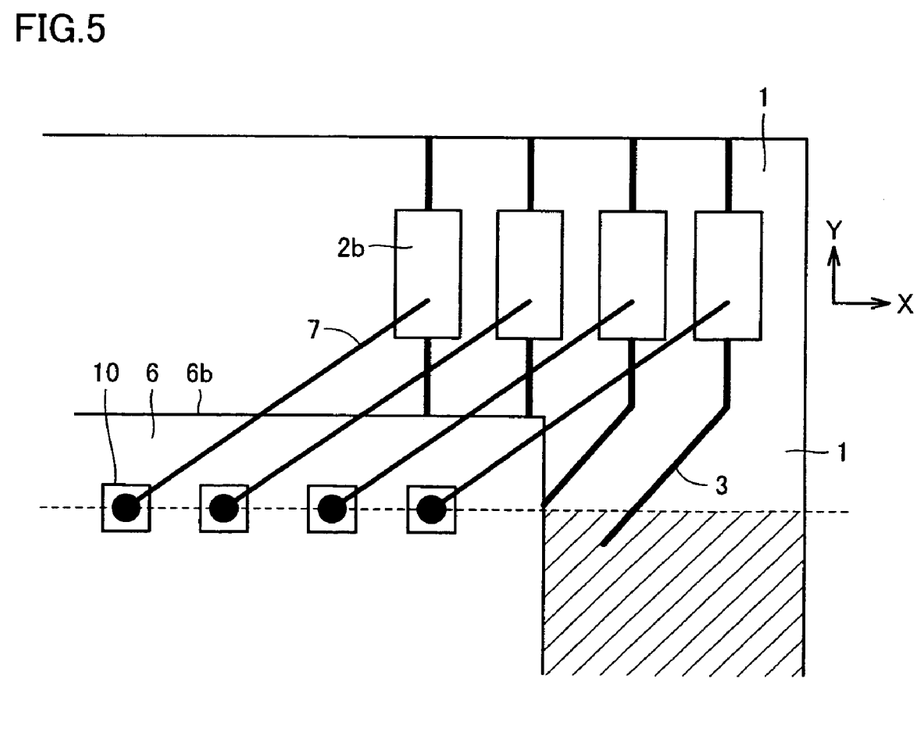
FIG. 5 shows that conventional bonding fingers are not arranged "outside the side adjacent to the side of the semiconductor element along which the connection pad group is arranged" in the present specification.

Here, if a bonding position of the semiconductor element is displaced or a space between bonding fingers 2b becomes larger in a conventional example as shown in FIG. 5, an X-direction component in the direction in which bonding wire 7 is drawn out may increase. Meanwhile, as the term in the present specification has been defined as described above, bonding finger 2b shown in FIG. 5 is arranged in an area different from an area "outside the side adjacent to the side of the semiconductor element along which the connection pad group is arranged" (hatched area) in the present specification.

According to the present embodiment, connection pad 10 of connection pad groups 10A, 10B is electrically connected to bonding finger 2a by wire bonding, whereby the following effect is obtained.

Figure 6A:
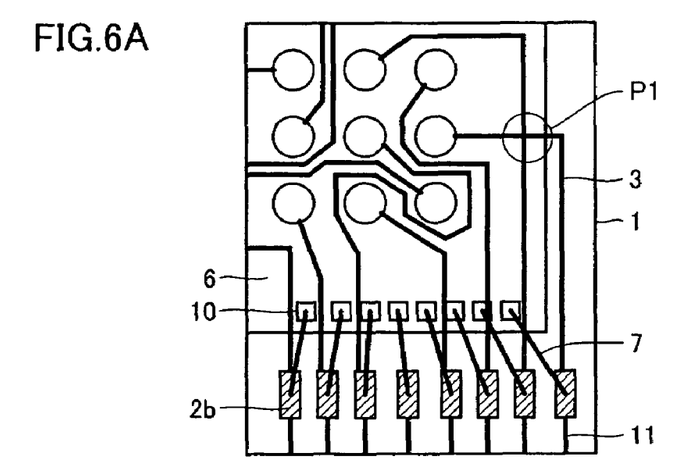
FIGS. 6A to 6C illustrate an effect achieved by the semiconductor device in the first embodiment of the present invention.

Referring to FIG. 6A, in an attempt to establish connection from connection pad 10 to bonding finger 2b on substrate 1 by bonding wire 7 or the like, routing requiring intersection of copper interconnections 3 on substrate 1 (area P1) may occur, resulting in failure in substrate design. In such a case, bonding wires 7 may three-dimensionally intersect by wiring as shown with an area P2 in FIG. 6B. Bonding wires 7, however, are too proximate to each other or they may contact with each other, which will result in lower quality.

Figure 6B:
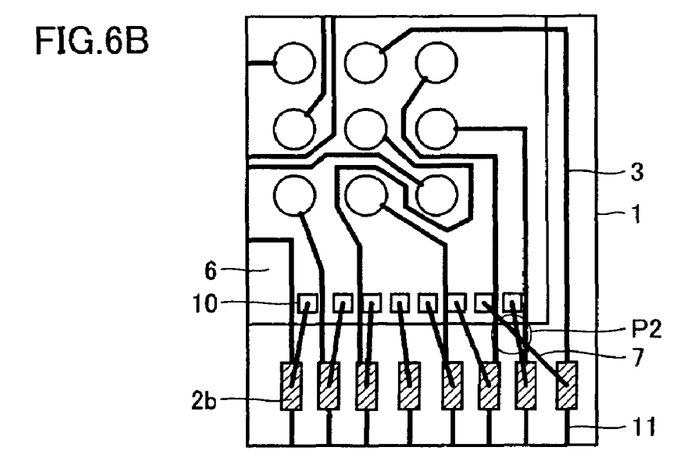
Figure 6C:
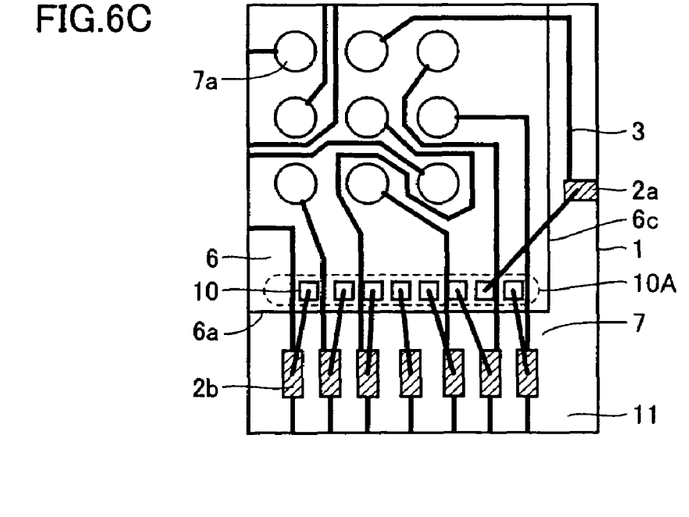

According to the present embodiment, bonding finger 2b is arranged outside side 6c adjacent to side 6a along which connection pad group 10A is arranged, and bonding finger 2b is connected to connection pad 10 by wire bonding, as shown in FIG. 6C. Therefore, intersection of copper interconnections 3 as shown in FIG. 6A and three-dimensional intersection of bonding wires 7 as shown in FIG. 6B can be prevented.

Figure 7:
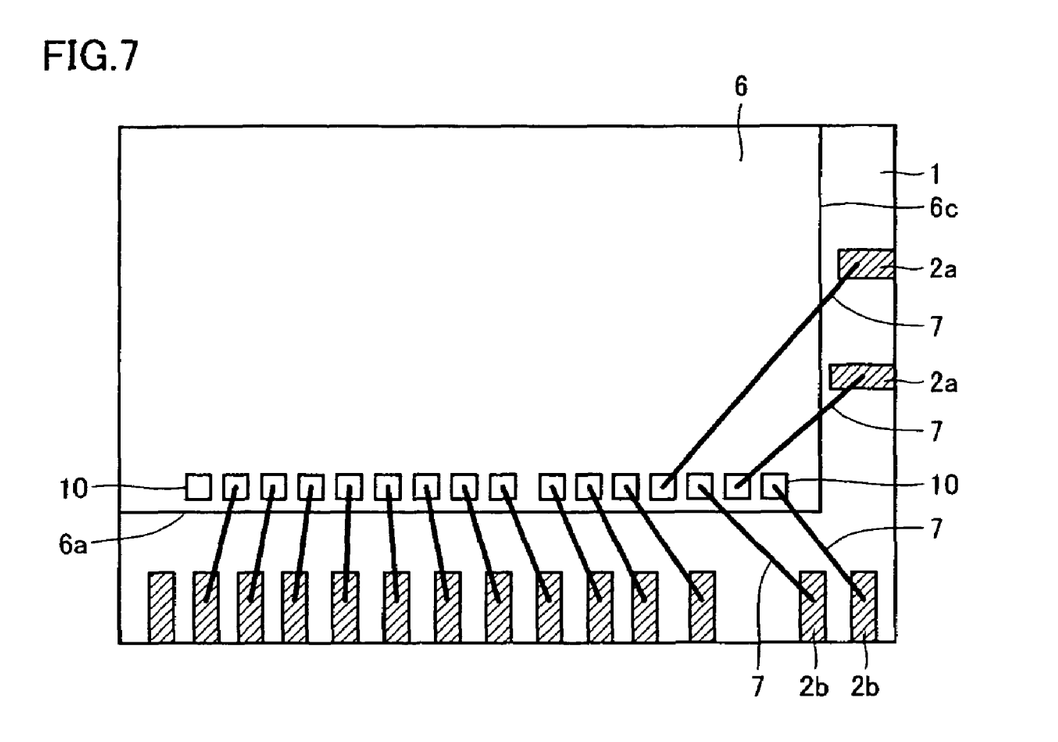
FIG. 7 shows that a plurality of bonding wires are drawn toward "outside the side adjacent to the side of the semiconductor element along which the connection pad group is arranged."

In addition, as shown in FIG. 7, any bonding wire 7 may be selected and drawn out so as to facilitate routing of copper interconnections 3 on substrate 1, and two or more bonding wires may be selected. In other words, two or more bonding fingers 2a may be provided, and each of bonding fingers 2a may be connected to connection pad 10 by wire bonding.

Figure 8:
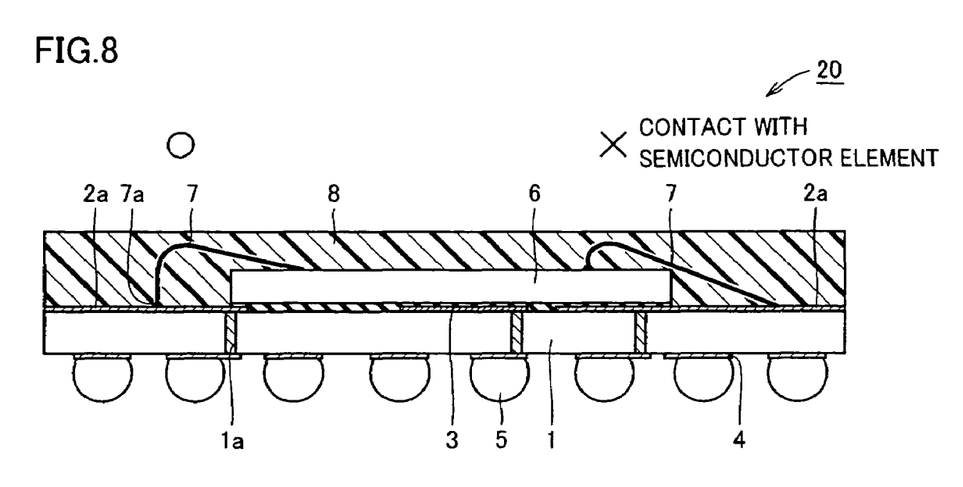
FIG. 8 is a cross-sectional view showing a first preferred example of the bonding wire.

In wiring in the present embodiment, as shown with bonding wire 7 on the right in FIG. 8, connection pad 10 and bonding finger 2b are positioned apart from each other. That is, as bonding wire 7 is drawn out by a large length, the following disadvantages may occur.

(1) Bonding wire 7 may contact with an edge of semiconductor element 6.

(2) Adjacent bonding wires 7 may contact with each other, depending on a direction in which bonding wire 7 is drawn out.

Considering these possibilities, a portion of bonding wire 7 may intentionally be located higher than the surface of substrate 1. In this case, however, the following disadvantages may occur, as shown by bonding wires 7 on the left in FIG. 9.

Figure 9:
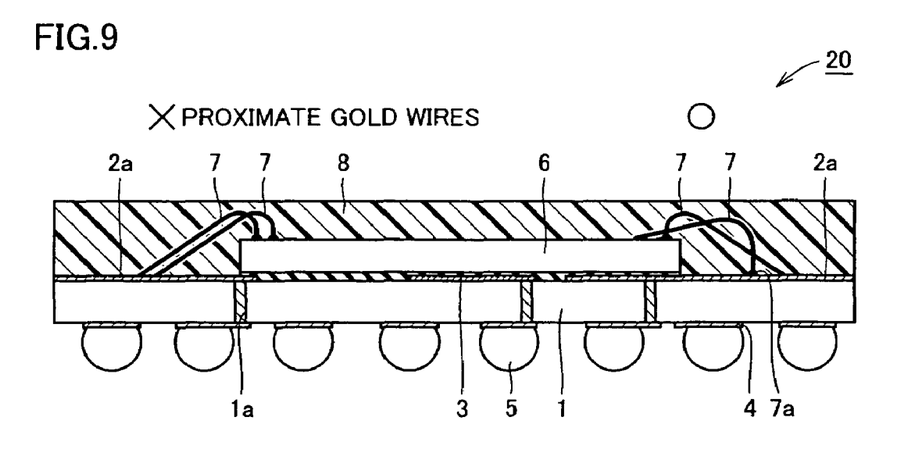
FIG. 9 is a cross-sectional view showing a second preferred example of the bonding wire.

(1) The total height of the semiconductor device becomes larger.

(2) Displacement of bonding wire 7 tends to occur and short-circuit between bonding wires 7 takes place.

As described above, it is necessary to reduce the overall height of bonding wire 7 from the surface of substrate 1 as well as to prevent short-circuit between adjacent bonding wires 7. Then, bonding wire 7 drawn "outside the side adjacent to the side of the semiconductor element along which the connection pad group is arranged" is shaped as shown with bonding wire 7 on the left in FIG. 8 or bonding wire 7 on the right in FIG. 9, with a ball bonding 7a provided on the side of bonding finger 2a. In this manner, the disadvantages as above can be overcome and the quality of the product can be improved.

Though this configuration can be achieved in a leadframe using a 42 alloy, copper or the like, higher effect can be obtained in the BGA having the solder ball serving as an external connection terminal on a lower surface of the semiconductor device.

In an ASIC (Application Specific Integrated Circuit) or a microcomputer type semiconductor, a large number of input/output pins themselves are required. In addition, the ASIC or the microcomputer type semiconductor is custom-made in many cases. Therefore, connection pads are arranged uniformly on four sides of the semiconductor element at the time of design. Accordingly, few problems will be caused without measures as described above. On the other hand, in a memory type semiconductor, a demand for smaller semiconductor element size is great, and arrangement and an area for the connection pads are restricted. Accordingly, since the connection pads are arranged on two sides of the semiconductor element, the effect of the present embodiment will be more significant, as the number of connection pads is increased.

In order to avoid an interpretation of the side of the semiconductor element along which dummy connection pads are arranged as "the side of the semiconductor element along which the connection pad group is arranged" in a broader interpretation of "the side adjacent to the side of the semiconductor element along which the connection pad group is arranged," "the side of the semiconductor element along which the connection pad group is arranged" is defined as the side along which the connection pads actually wired to the bonding fingers are arranged.

(Second Embodiment)

The configuration in the first embodiment attains not only the effect in routing but also an effect to suppress an outer size of the semiconductor element. When the number of input/output pins of the semiconductor element is large, the number of bonding fingers should correspondingly be large. As to the shape or arrangement of the bonding finger and the connection pad, a width of 150 μm of the bonding finger is necessary, a pitch between the bonding fingers should be set to approximately 200 μm, an opening diameter of the connection pad should be set to 60 μm to 80 μm, and a pitch between the connection pads should generally be set broader than in an example in which it is set to 100 μm to 120 μm. If the width of the bonding finger or the pitch between the bonding fingers is forcibly made smaller, disadvantages as below will occur, in which case it will be difficult to maintain a stable quality of the product.

(1) Substrate: Designing becomes impossible due to a problem in working accuracy of the substrate, or cost for working of the substrate increases.

(2) Wire bonding: A width for stitch bonding to the bonding finger is insufficient, resulting in poor connection.

(3) Quality: A distance between plated wires on an outer periphery of the package is made smaller, which can be a cause of a defect such as short-circuit at an end portion.

As described above, a minimal outer dimension of the semiconductor device employing the semiconductor element including a large number of input/output pins is determined by a width over which the bonding fingers can be arranged. On the other hand, the bonding finger is positively arranged "outside the side adjacent to the side of the semiconductor element along which the connection pad group is arranged," so that the outer dimension of the semiconductor device can be made smaller by L1+L2 each covered by one connection pad (bonding finger) in FIGS. 10A and 10B or by M1×2 in FIG. 11.

Figure 10A:
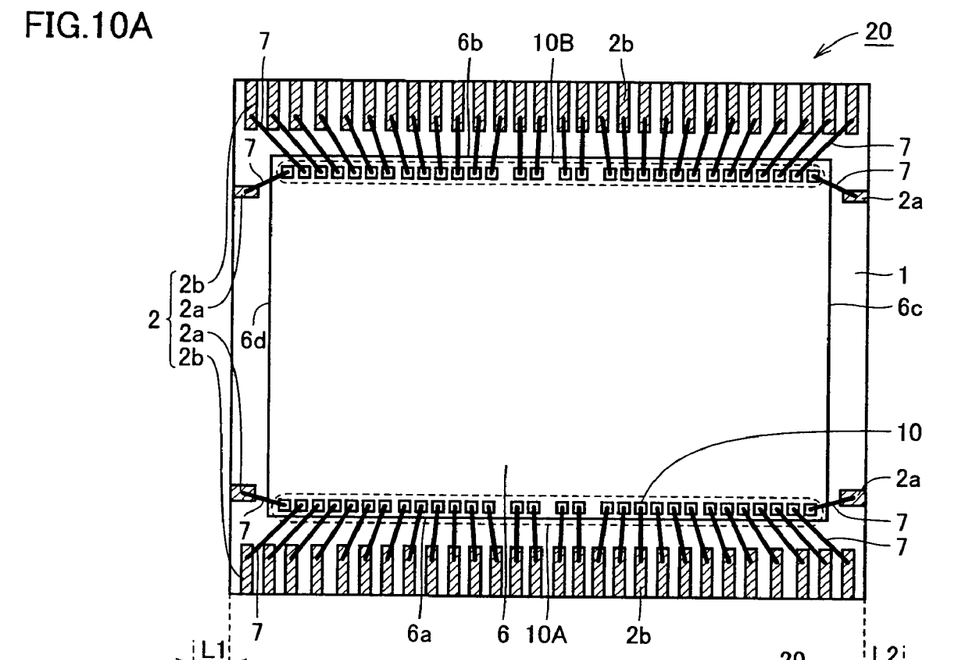
FIGS. 10A and 10B are first plan views showing that an outer dimension of the semiconductor device can be reduced in a second embodiment of the present invention.
Figure 10B:
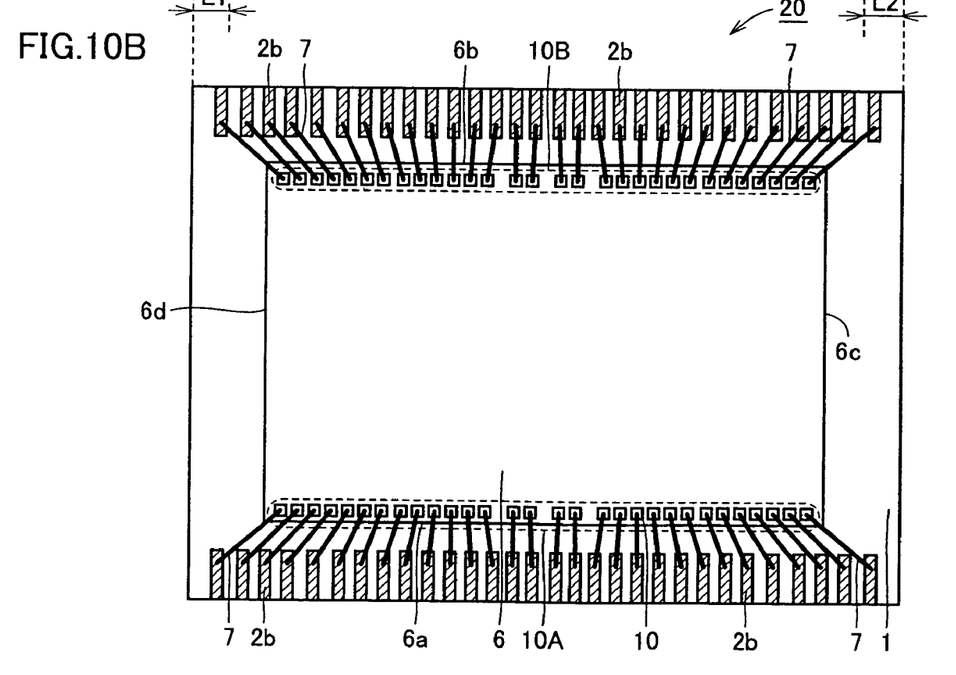
Figure 11:
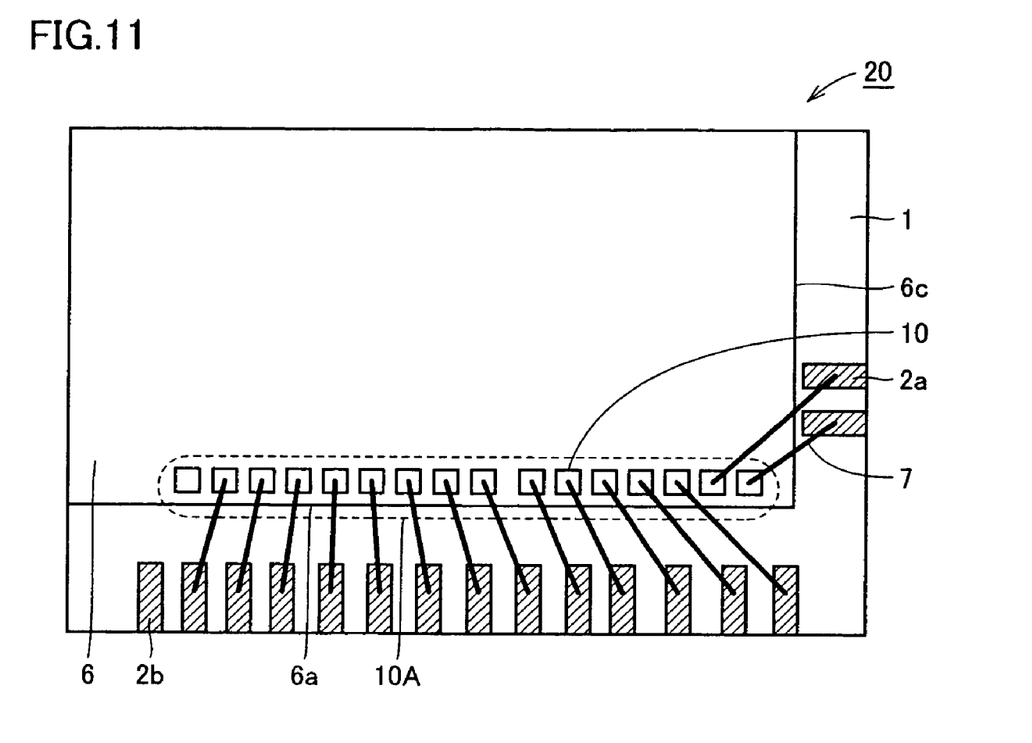
FIG. 11 is a second plan view showing that the outer dimension of the semiconductor device can be reduced in the second embodiment of the present invention.

In other words, the outer dimension of the semiconductor device can be made smaller by L1+L2 by arranging bonding fingers 2a "outside the side adjacent to the side of the semiconductor element along which the connection pad group is arranged" as shown in FIG. 10A, as compared with the example in which all bonding fingers 2b are arranged outside "the side of the semiconductor element along which the connection pad group is arranged" as shown in FIG. 10B.

The semiconductor device in the present embodiment is effective because a demand for products attaining high density and smaller size has been great in a market of PDA (Personal Digital Assistant), a portable telephone, a DSC (Digital Still Camera) or the like in recent days.

Figure 12A:
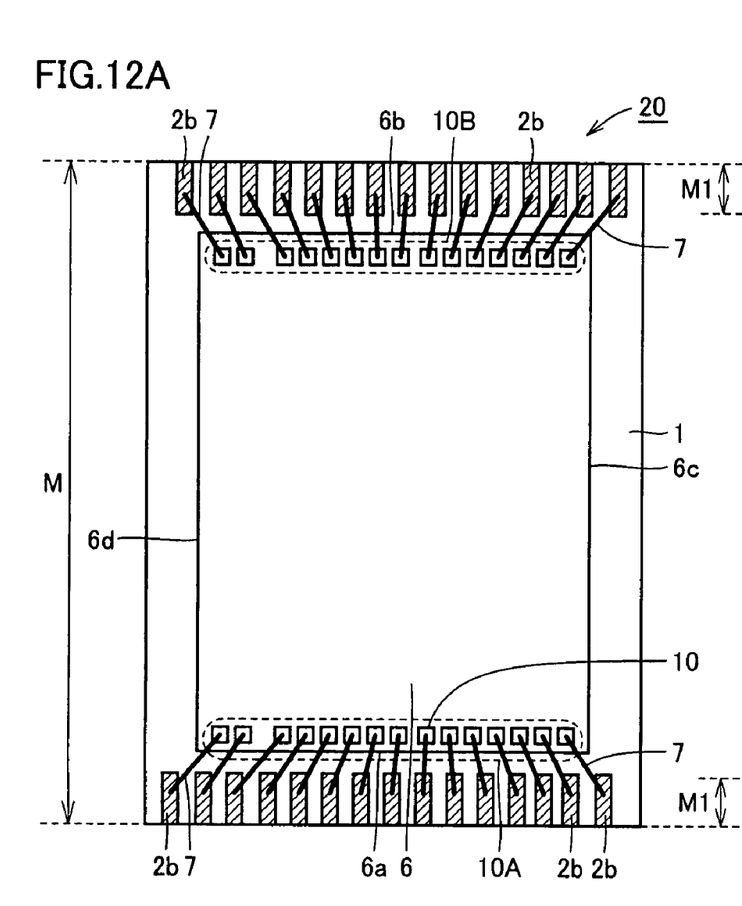
FIGS. 12A and 12B are third plan views showing that the outer dimension of the semiconductor device can be reduced in the second embodiment of the present invention.
Figure 12B:
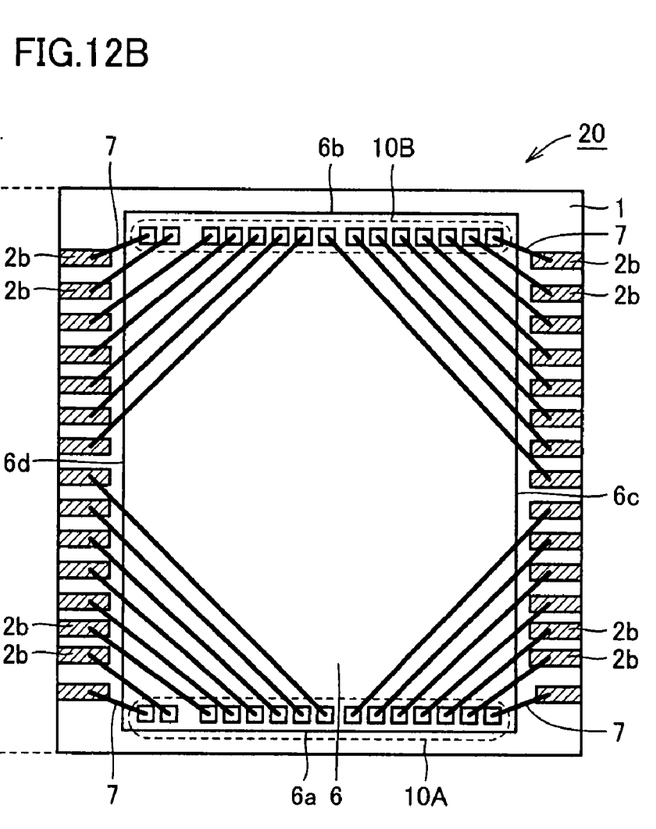

Moreover, in rectangular semiconductor element 6 in which connection pads 10 are arranged on a shorter side as shown in FIG. 12A, bonding wires 7 are drawn out from all connection pads 10 to bonding fingers 2a arranged outside sides 6c, 6d adjacent to sides 6a, 6b along which connection pad groups 110A, 10B are arranged respectively, as shown in FIG. 12B. Accordingly, the outer dimension of the semiconductor device can be made smaller by M1×2.

(Third Embodiment)

In a product such as an S-CSP (Stacked Chip Scale Package) obtained by stacking semiconductor elements, the number of connection pads is increased, routing of the copper interconnections is further complicated, and an extremely large number of bonding fingers are necessary unless connection among semiconductor elements is shared. In other words, it is more difficult to route the copper interconnections on the substrate as well as to reduce the outer dimension of the semiconductor device than in the product using a single semiconductor element as in the first or second embodiment.

Figure 13:
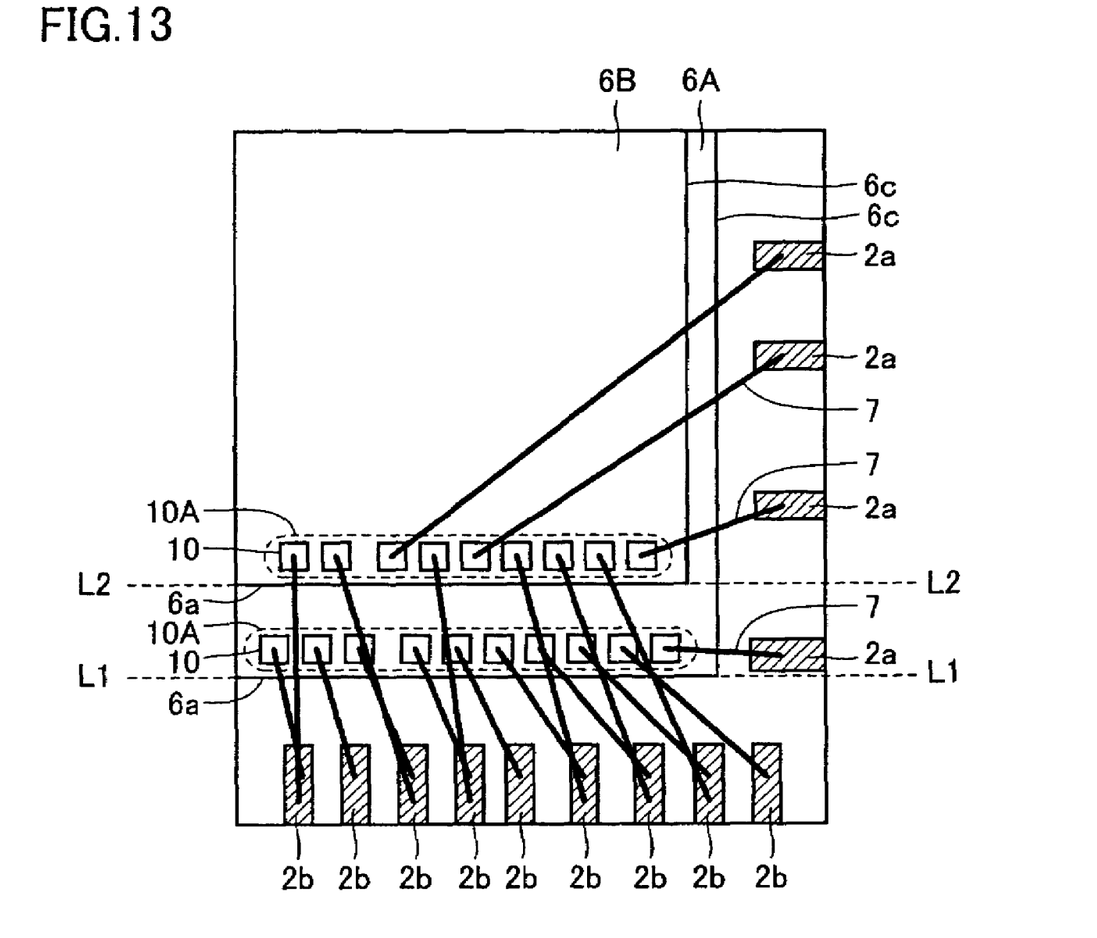
FIG. 13 is a plan view showing a first example of a configuration obtained by stacking semiconductor elements.
Figure 14:
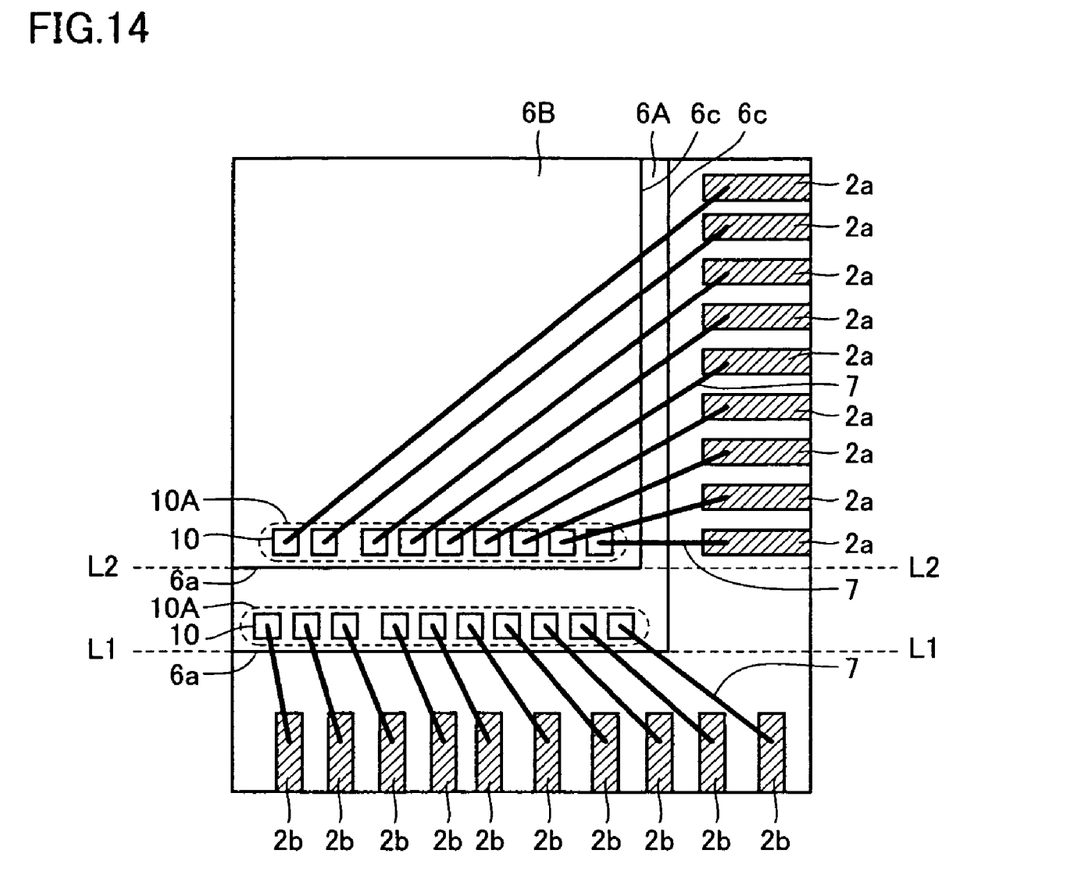
FIG. 14 is a plan view showing a second example of a configuration obtained by stacking semiconductor elements.
Figure 15:
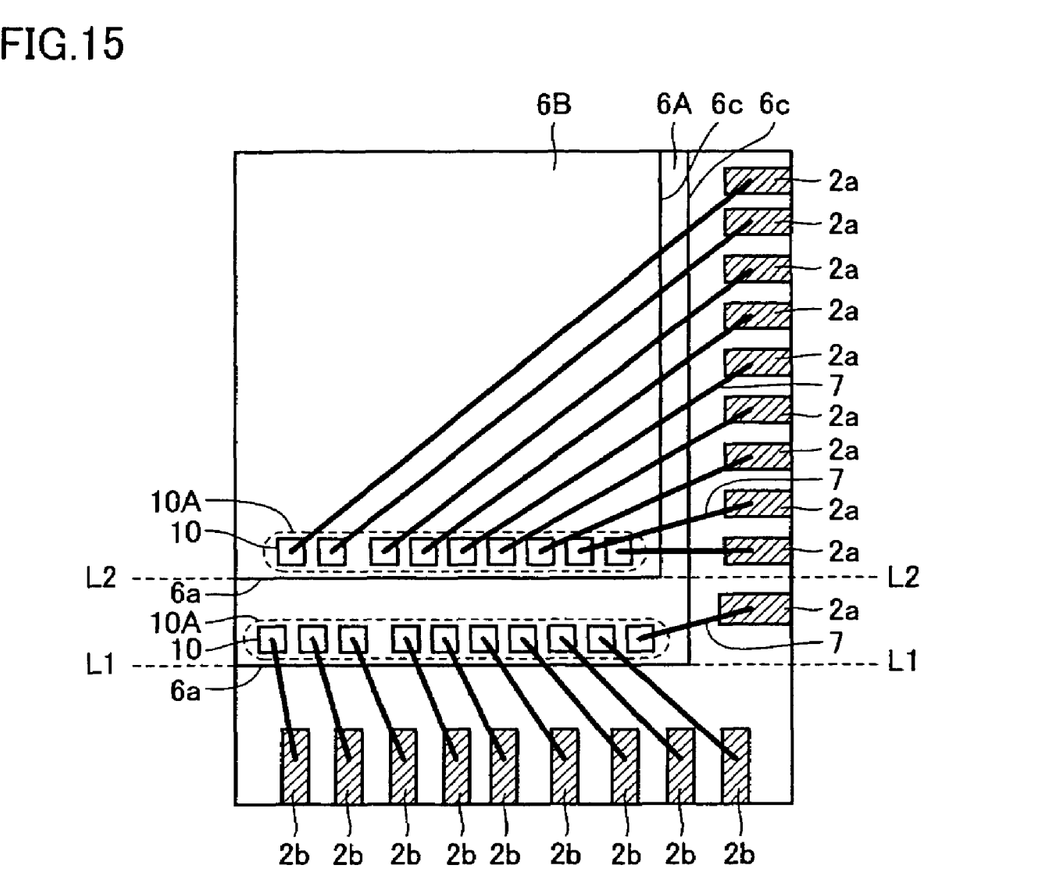
FIG. 15 is a plan view showing a third example of a configuration obtained by stacking semiconductor elements.

Here, as shown in FIGS. 13 to 15, in a configuration implemented by stacking two or more semiconductor elements (two semiconductor elements 6A, 1B in the present embodiment), bonding fingers 2a are provided outside sides 6c, 6c adjacent to sides 6a, 6a of semiconductor elements 6A, 6B along which connection pad groups 10A, 10A are arranged respectively, and bonding fingers 2a are electrically connected to connection pads 10 by bonding wires 7 respectively.

In the configuration shown in FIGS. 13 to 15, semiconductor element 6A and semiconductor element 6B are stacked such that side 6a of semiconductor element 6A along which connection pad group 10A is arranged and side 6a of semiconductor element 6B along which connection pad group 10A is arranged are located respectively on phantom lines L1—L1, L2—L2 parallel to each other.

Here, connection pad 10 of any one of semiconductor elements 6A, 1B should only be connected to bonding finger 2a, and at least one connection pad 10 among the plurality of connection pads 10 should only be connected to bonding finger 2a. Each of all connection pads in connection pad group 10A of any one of semiconductor elements 6A, 1B may be connected to bonding finger 2a.

Figure 16:
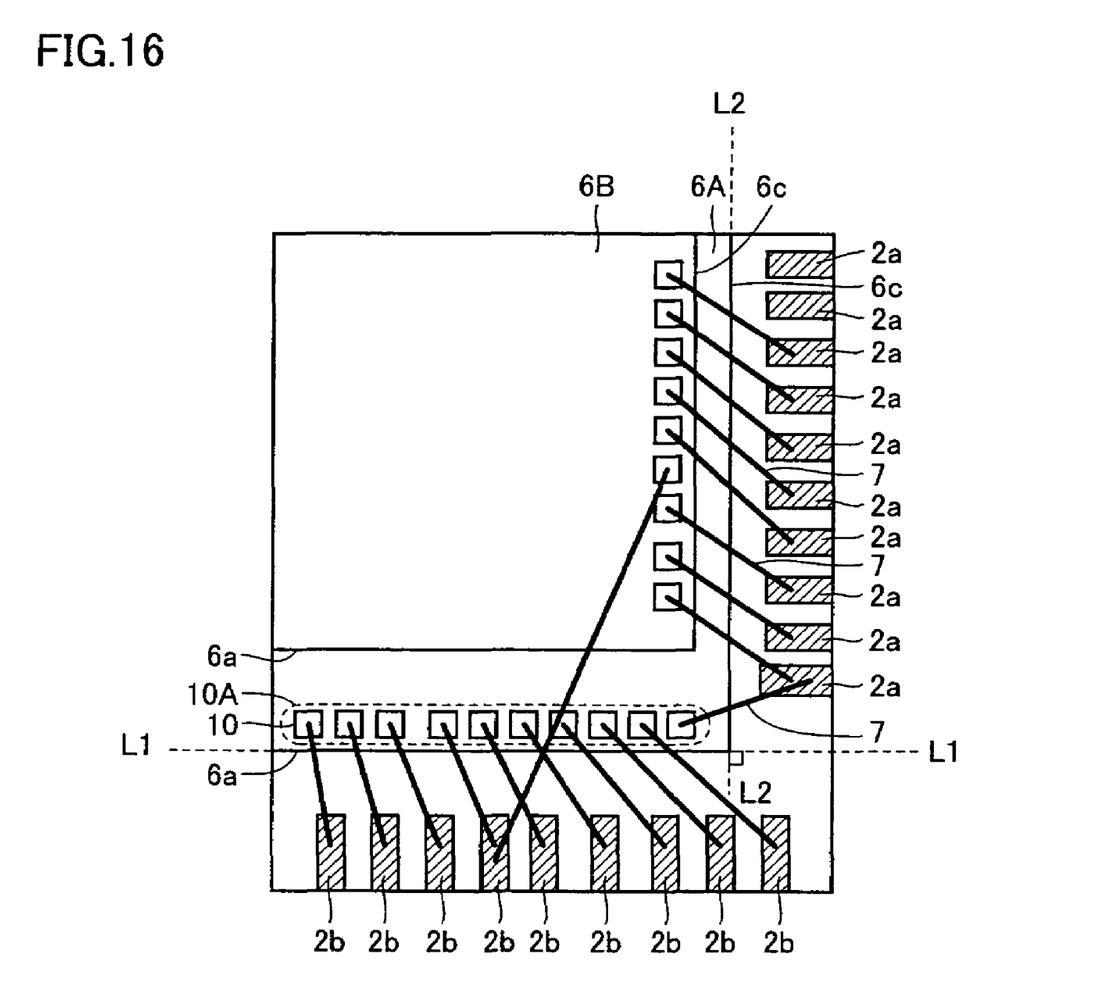
FIG. 16 is a plan view showing a fourth example of a configuration obtained by stacking semiconductor elements.
Figure 17:
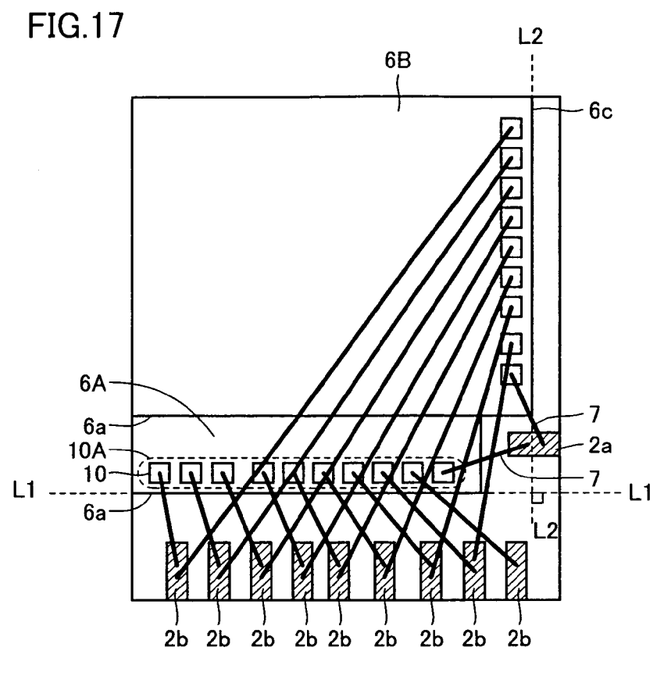
FIG. 17 is a plan view showing a fifth example of a configuration obtained by stacking semiconductor elements.

In addition, as in the configuration shown in FIGS. 16 and 17, semiconductor element 6A and semiconductor element 6B are stacked such that side 6a of semiconductor element 6A along which connection pad group 10A is arranged and side 6a of semiconductor element 6B along which connection pad group 10A is arranged are located respectively on phantom lines L1—L1, L2—L2 intersecting (orthogonal, for example) with each other.

Here, connection pad 10 of semiconductor element 6A is electrically connected by bonding wire 7 to bonding finger 2a arranged outside side 6c adjacent to side 6a of semiconductor element 6A along which connection pad group 10A is arranged. In addition, connection pad 10 of semiconductor element 6B is electrically connected by bonding wire 7 to bonding finger 2b arranged outside side 6d adjacent to side 6a of semiconductor element 6B along which connection pad group 10A is arranged.

Figure 18:
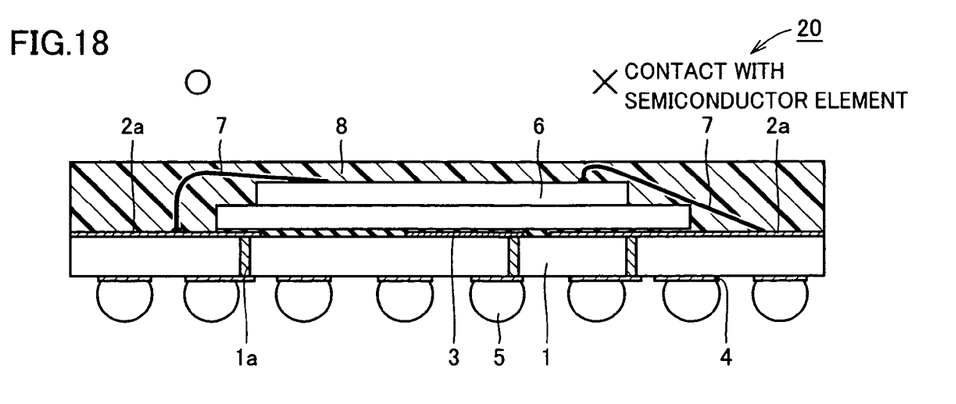
FIG. 18 is a cross-sectional view showing a preferred example of the bonding wire when the semiconductor elements are stacked.

When the semiconductor elements are stacked, a distance between the position of connection pad 10 and the position of bonding finger 2b further increases, as shown on the right in FIG. 18. Accordingly, the disadvantage described in the first embodiment is further likely.

Then, ball bonding 7a is provided on the side of bonding fingers 2a, 2b as shown on the left in FIG. 18, as in the first embodiment. As such, contact of bonding wire 7 with semiconductor elements 6A, 1B or short-circuit between adjacent bonding wires 7 can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
    a substrate;
    a plurality of bonded portions formed on a surface of said substrate; and
    a semiconductor element arranged above the surface of said substrate and having a plurality of connection pads on a surface opposite to a surface facing said substrate; wherein
    a group of said plurality of connection pads is aligned along one side of said semiconductor element;
    said group of said plurality of connection pads includes a first connection pad, a second connection pad and a third connection pad;
    said second connection pad is aligned between said first connection pad and said third connection pad;
    said semiconductor element comprises a second side adjacent said one side;
    one of said bonded portions is arranged in an outside area of said second side of said semiconductor element;
    said group said second connection pad is electrically connected to said one bonded portion by wire bonding; and
    said first connection pad and said third connection pad are electrically connected to corresponding bonded portions of said bonded portions arranged in an outside area of said one side of said semiconductor element by wire bonding.

2. The semiconductor device according to claim 1, wherein
    said one bonded portion is electrically connected by wire bonding to an inner connection pad other than the connection pad at an end portion of said aligned connection pad group.

3. The semiconductor device according to claim 1, further comprising another semiconductor element stacked on said semiconductor element, wherein
    a second group of connection pads group is aligned along a side of said another semiconductor element along said side on a surface of said another semiconductor element, and
    said semiconductor element and said another semiconductor element are stacked such that the side of said semiconductor element along which said connection pad group is arranged and the side of said another semiconductor element along which said second connection pad group is arranged are located respectively on phantom lines parallel to each other.

4. The semiconductor device according to claim 1, further comprising another semiconductor element stacked on said semiconductor element, wherein
    a second group of connection pads group is aligned along a side of said another semiconductor element along said side on a surface of said another semiconductor element, and said semiconductor element and said another semiconductor element are stacked such that the side of said semiconductor element along which said connection pad group is arranged and the side of said another semiconductor element along which said second connection pad group is arranged are located respectively on phantom lines intersecting with each other.

* * * * *